(12) United States Patent  (10) Patent No.: US 9,153,691 B1
Dutta  (45) Date of Patent: Oct. 6, 2015

(54) HIGH VOLTAGE MOS TRANSISTOR

(71) Applicant: QUALCOMM Incorporated, San Diego, CA (US)

(72) Inventor: Ranadeep Dutta, Del Mar, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/338,294

(22) Filed: Jul. 22, 2014

(51) Int. Cl.
H01L 29/76 (2006.01)
H01L 29/94 (2006.01)
H01L 31/062 (2012.01)
H01L 31/113 (2006.01)
H01L 31/119 (2006.01)
H01L 21/331 (2006.01)
H01L 29/78 (2006.01)
H01L 29/66 (2006.01)
G06F 17/50 (2006.01)

(52) U.S. Cl.
CPC ........ H01L 29/7835 (2013.01); G06F 17/5072 (2013.01); H01L 29/6659 (2013.01); H01L 29/66492 (2013.01); H01L 29/66659 (2013.01); H01L 29/66681 (2013.01); H01L 29/7816 (2013.01)

(58) Field of Classification Search
CPC ............ H01L 29/7835; H01L 29/7816; H01L 29/66681; H01L 29/66492; G06F 17/5072
USPC ........................................... 257/344; 438/366
See application file for complete search history.

(56) References Cited

U.S. PATENT DOCUMENTS

| 8,611,108 | B2 | 12/2013 | Disney |
| 8,686,499 | B2 | 4/2014 | Katayama et al. |
| 2010/0084686 | A1 | 4/2010 | Cai et al. |
| 2013/0093012 | A1 | 4/2013 | Zhang et al. |
| 2013/0154016 | A1* | 6/2013 | Glass et al. ................... 257/368 |
| 2014/0021546 | A1 | 1/2014 | Onoda |

* cited by examiner

Primary Examiner — David S Blum
(74) Attorney, Agent, or Firm — Arent Fox LLP

(57) ABSTRACT

In one aspect, a MOS transistor includes a first diffusion region of a first doping type, a tap region of a second doping type configured to contact the first diffusion region, a channel region configured to substantially surround the first diffusion region and the tap region, and a second diffusion region of the first doping type configured to substantially surround the channel region. In another aspect, a method for manufacturing a MOS transistor includes, forming a first diffusion region of a first doping type, forming a tap region of a second doping type contacting the first diffusion region, forming a second diffusion region of the first doping type substantially surrounding the first diffusion region and the tap region, and forming a gate electrode substantially surrounding the first diffusion region and the tap region.

28 Claims, 11 Drawing Sheets

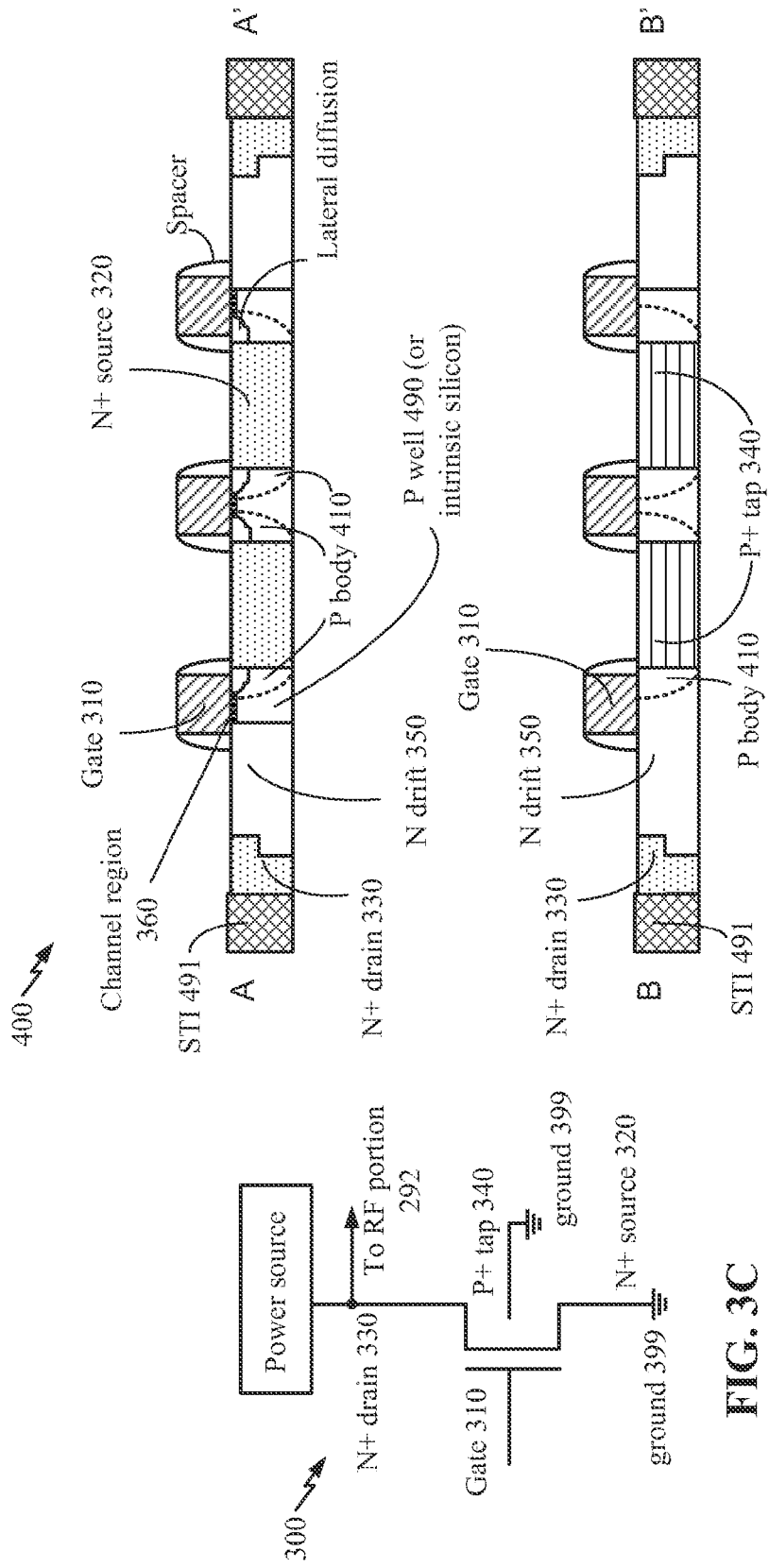

HIGH VOLTAGE MOS TRANSISTOR

BACKGROUND

1. Field

The disclosure relates generally to semiconductor devices and, in particular, to metal-oxide-semiconductor (MOS) transistors.

2. Background

High-voltage MOS (HVMOS) transistors play an important role in wireless communication today. For example, a wireless device (e.g., a cellular phone or a smart phone) may transmit and receive data for two-way communication with a wireless communication system. The wireless device may include a transmitter for data transmission and a receiver for data reception. For data transmission, the transmitter may modulate a transmit local oscillator (LO) signal with data to obtain a modulated radio frequency (RF) signal, amplify the modulated RF signal to obtain an output RF signal having the desired output power level, and transmit the output RF signal via an antenna to a base station. For data reception, the receiver may obtain a received RF signal via the antenna, amplify and downconvert the received RF signal with a receive LO signal, and process the downconverted signal to recover data sent by the base station.

Typically, the RF functions operate at a higher voltage than the digital portions of the chipset within the wireless device. Because a higher breakdown voltage is needed, the HVMOS transistors may be utilized to provide power to the RF functions. However, those HVMOS transistors may not be integrated with the digital portions of the chipset within the wireless device. In one example, HVMOS transistors may require special steps and materials in the fabrication process. The HVMOS transistors would thus need to be fabricated separately from the digital components, adding to the manufacturing cost and consuming precious space within the wireless device.

SUMMARY

Aspects of a MOS transistor are disclosed. The MOS transistor includes a first diffusion region of a first doping type, a tap region of a second doping type configured to contact the first diffusion region, a channel region configured to substantially surround the first diffusion region and the tap region, and a second diffusion region of the first doping type configured to substantially surround the channel region.

Aspects of a method for manufacturing a MOS transistor are disclosed. The method includes forming a first diffusion region of a first doping type, forming a tap region of a second doping type contacting the first diffusion region, forming a second diffusion region of the first doping type substantially surrounding the first diffusion region and the tap region, and forming a gate electrode substantially surrounding the first diffusion region and the tap region.

Aspects of an apparatus for generating a layout of a MOS transistor are provided. The apparatus includes a memory and at least one processor coupled to the memory. The at least one processor is configured to store a layout cell in the memory. The layout cell includes information indicating a single instance of a first diffusion region of a first doping type, a single instance of a tap region of a second doping type contacting the first diffusion region, and a single instance of a channel region substantially surrounding the first diffusion region and the tap region. The at least one processor is further configured to duplicate the layout cell, and the duplicated layout cells are configured as an array.

It is understood that other aspects of apparatus and methods will become readily apparent to those skilled in the art from the following detailed description, wherein various aspects of apparatus and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

FIG. 3C is a diagram illustrates an application of an exemplary embodiment of a MOS transistor.

FIG. 4 is a diagram illustrating cross-section views of another exemplary embodiment of a MOS transistor along the A-A' and B-B' axes.

DETAILED DESCRIPTION

Figure 1:
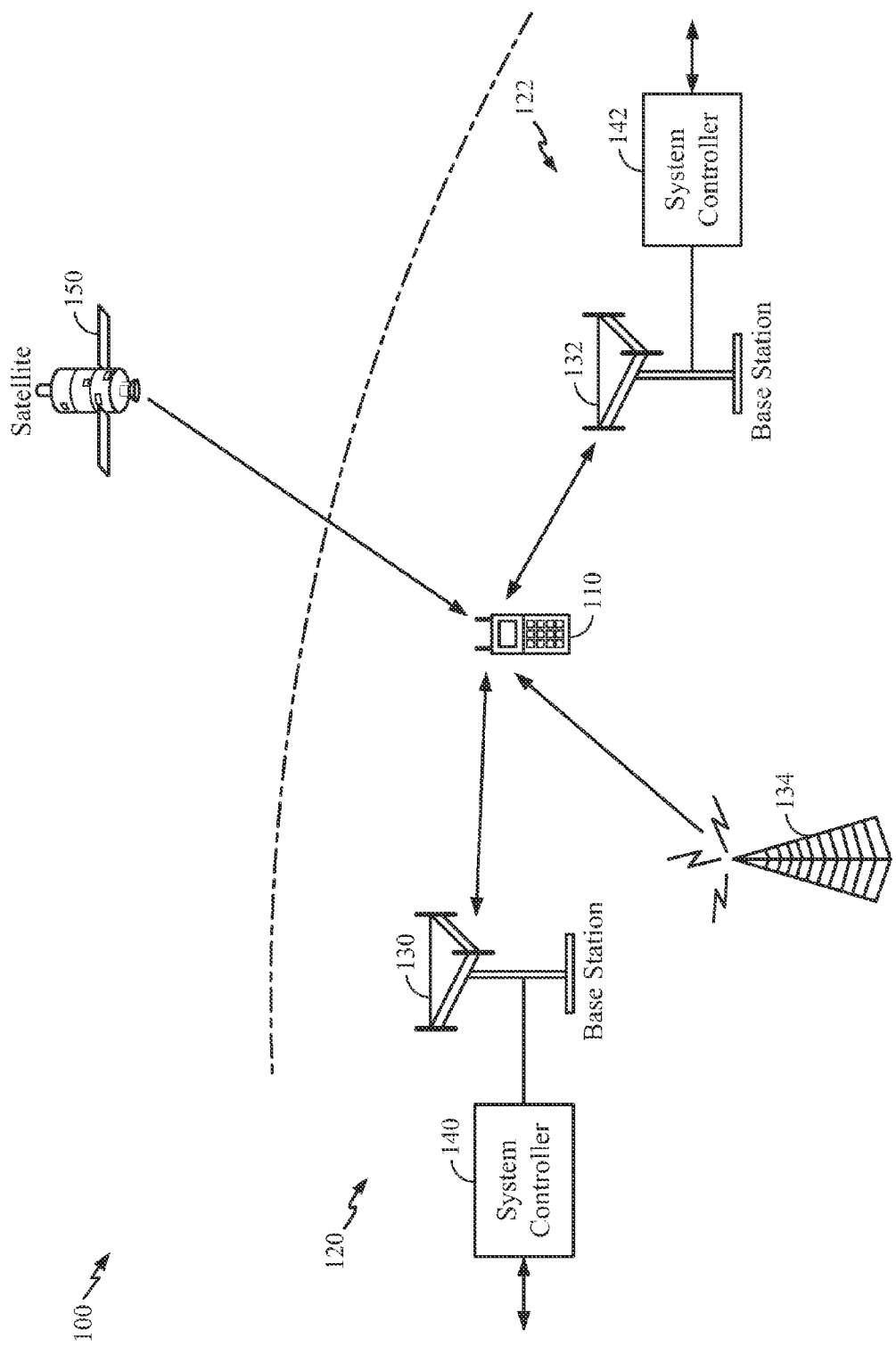
FIG. 1 illustrates a wireless device and communication systems in which an exemplary embodiment may be included.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. The term "exemplary" is used herein to mean "serving as an example, instance, or illustration." Any design described herein as "exemplary" is not necessarily to be construed as preferred or advantageous over other designs.

Several aspects of telecommunication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise random-access memory (RAM), read-only memory (ROM), electronically erasable programmable ROM (EEPROM), compact disk (CD) ROM (CD-ROM), or other optical disk storage, magnetic disk storage or other magnetic storage devices, or any other medium that can be used to carry or store desired program code in the form of instructions or data structures and that can be accessed by a computer. Disk and disc, as used herein, includes CD, laser disc, optical disc, digital versatile disc (DVD), and floppy disk where disks usually reproduce data magnetically, while discs reproduce data optically with lasers. Combinations of the above should also be included within the scope of computer-readable media.

FIG. 1 illustrates a wireless device (e.g., wireless device 110) and communication systems (e.g., wireless systems 120 and 122) in which an exemplary embodiment may be included. The wireless systems 120, 122 may each be a Code Division Multiple Access (CDMA) system, a Global System for Mobile Communications (GSM) system, a Long Term Evolution (LTE) system, a wireless local area network (WLAN) system, or some other wireless system. A CDMA system may implement Wideband CDMA (WCDMA), CDMA 1x or cdma2000, Time Division Synchronous Code Division Multiple Access (TD-SCDMA), or some other version of CDMA. TD-SCDMA is also referred to as Universal Terrestrial Radio Access (UTRA) Time Division Duplex (TDD) 1.28 Mcps Option or Low Chip Rate (LCR). LTE supports both frequency division duplexing (FDD) and time division duplexing (TDD). For example, the wireless system 120 may be a GSM system, and the wireless system 122 may be a WCDMA system. As another example, the wireless system 120 may be an LTE system, and the wireless system 122 may be a CDMA system.

For simplicity, the diagram 100 shows the wireless system 120 including one base station 130 and one system controller 140, and the wireless system 122 including one base station 132 and one system controller 142. In general, each wireless system may include any number of base stations and any set of network entities. Each base station may support communication for wireless devices within the coverage of the base station. The base stations may also be referred to as a Node B, an evolved Node B (eNB), an access point, a base transceiver station, a radio base station, a radio transceiver, a transceiver function, a basic service set (BSS), an extended service set (ESS), or some other suitable terminology. The wireless device 110 may also be referred to as a user equipment (UE), a mobile device, a remote device, a wireless device, a wireless communications device, a station, a mobile station, a subscriber station, a mobile subscriber station, a terminal, a mobile terminal, a remote terminal, a wireless terminal, an access terminal, a client, a mobile client, a mobile unit, a subscriber unit, a wireless unit, a remote unit, a handset, a user agent, or some other suitable terminology. The wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, or some other similar functioning device.

The wireless device 110 may be capable of communicating with the wireless system 120 and/or 122. The wireless device 110 may also be capable of receiving signals from broadcast stations, such as the broadcast station 134. The wireless device 110 may also be capable of receiving signals from satellites, such as the satellite 150, in one or more global navigation satellite systems (GNSS). The wireless device 110 may support one or more radio technologies for wireless communication such as GSM, WCDMA, cdma2000, LTE, 802.11, etc. The terms "radio technology," "radio access technology," "air interface," and "standard" may be used interchangeably.

The wireless device 110 may communicate with a base station in a wireless system via the downlink and the uplink. The downlink (or forward link) refers to the communication link from the base station to the wireless device, and the uplink (or reverse link) refers to the communication link from the wireless device to the base station. A wireless system may utilize TDD and/or FDD. For TDD, the downlink and the uplink share the same frequency, and downlink transmissions and uplink transmissions may be sent on the same frequency in different time periods. For FDD, the downlink and the uplink are allocated separate frequencies. Downlink transmissions may be sent on one frequency, and uplink transmissions may be sent on another frequency. Some exemplary radio technologies supporting TDD include GSM, LTE, and TD-SCDMA. Some exemplary radio technologies supporting FDD include WCDMA, cdma2000, and LTE.

Figure 2:
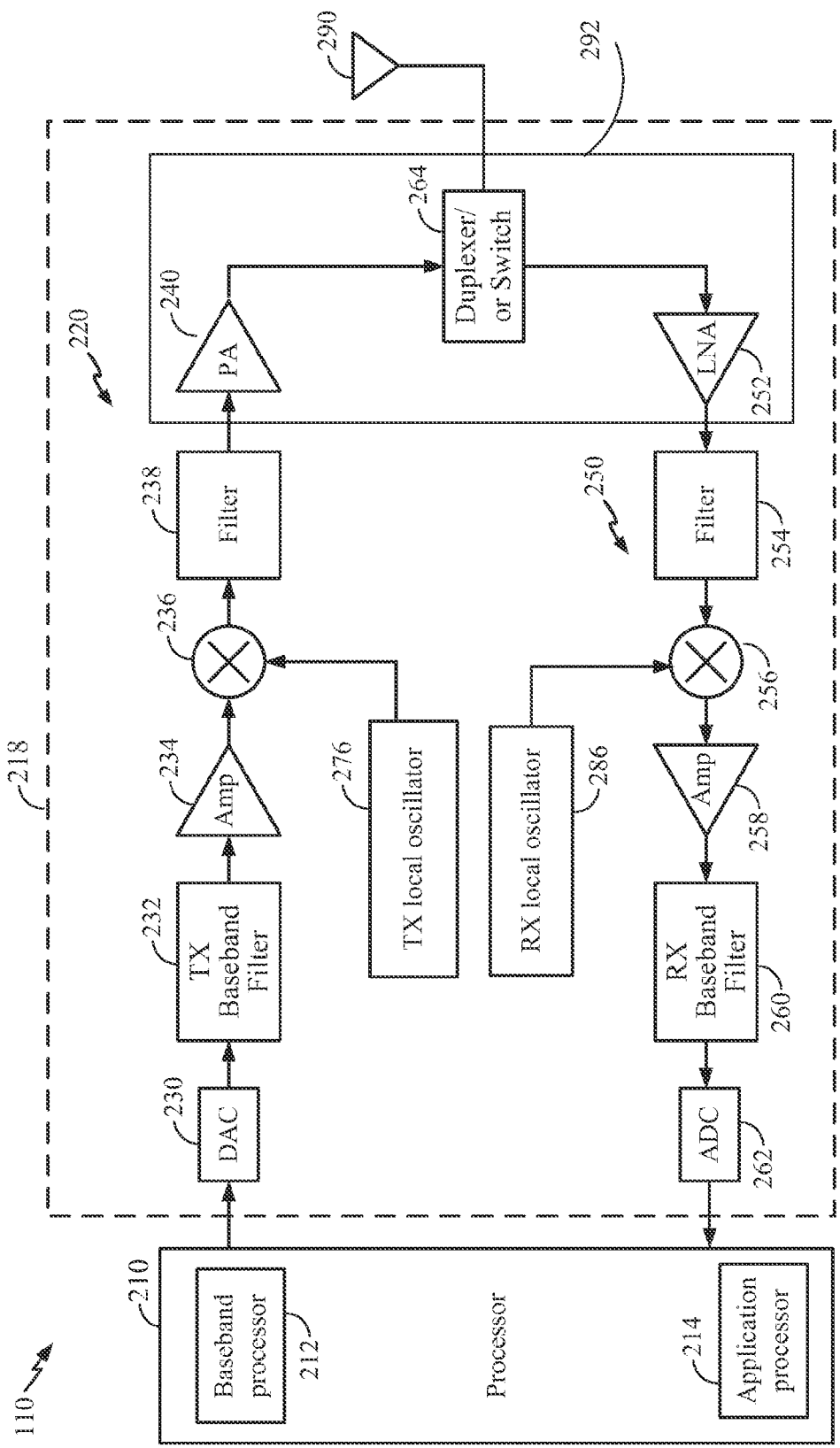
FIG. 2 is a block diagram of a wireless device in which an exemplary embodiment may be included.

FIG. 2 illustrates a block diagram of a wireless device (such as the wireless device 110) in which an exemplary embodiment may be included. The wireless transceiver 218 includes a transmitter 220 and a receiver 250 that support bi-directional communication. The transmitter 220 and/or the receiver 250 may be implemented with a super-heterodyne architecture or direct-conversion architecture. In the super-heterodyne architecture, a signal is frequency converted between RF and baseband in multiple stages (e.g., from RF to an intermediate frequency (IF) in one stage, and then from IF to baseband in another stage for a receiver). In the direct-conversion architecture, which is also referred to as a zero-IF architecture, a signal is frequency converted between RF and baseband in one stage. The super-heterodyne and direct-conversion architectures may use different circuit blocks and/or have different requirements. In the exemplary embodiment shown in FIG. 2, the transmitter 220 and the receiver 250 are implemented with a direct-conversion architecture.

In the transmit path, the baseband processor 212 provides data to a digital-to-analog converter (DAC) 230. The DAC 230 converts a digital input signal to an analog output signal. The analog output signal is provided to a filter 232, which filters the analog output signal to remove images caused by the prior digital-to-analog conversion by the DAC 230. An amplifier 234 is used to amplify the signal from the filter 232 to provide an amplified baseband signal. A mixer 236 receives the amplified baseband signal and an LO signal from TX local oscillator 276. The mixer 236 mixes the amplified baseband signal with the LO signal to provide an upconverted signal. A filter 238 is used to filter the upconverted signal to remove images caused by the frequency mixing. A power amplifier (PA) 240 is used to amplify the signal from the filter 238 to obtain an output RF signal at the desired output power level. The output RF signal is routed through a duplexer 264 to the antenna 290 for transmission over the wireless channel.

In the receive path, the antenna 290 may receive signals transmitted by a remote device. The received RF signal may be routed through the duplexer 264 to the receiver 250. Within the receiver 250, the received RF signal is amplified by a low noise amplifier (LNA) 252 and filtered by a filter 254 and to obtain an input RF signal. A mixer 256 receive the input RF signal and an LO signal from a RX local oscillator 286. The mixer 256 mixes the input RF signal with the LO signal to provide a downconverted signal. The downconverted signal is amplified by an amplifier 258 to obtain an amplified downconverted signal. A filter 260 is used to filter the amplified downconverted signal to remove images caused by the frequency mixing. The signal from the filter 260 is provided to an analog-to-digital converter (ADC) 262. The ADC 262 converts the signal to a digital output signal. The digital output signal may be provided to the baseband processor 212 for further processing. The ADC 262 may be a delta-sigma type ADC including an exemplary embodiment of an OTA performing the integration function.

The conditioning of the signals in the transmitter 220 and the receiver 250 may be performed by one or more stages of amplifiers, filters, mixers, etc. These circuits may be arranged differently from the configuration shown in FIG. 2. Furthermore, other circuits not shown in FIG. 2 may also be used to condition the signals in the transmitter 220 and the receiver 250. For example, impedance matching circuits may be located at the output of the PA 240, at the input of the LNA 252, between the antenna 290 and the duplexer 264, etc.

The wireless transceiver 218 communicates with the processor system 210. In particular, the processor system 210 may include a baseband processor to processing the signals to and from the wireless transceiver 218. The wireless transceiver 218 may further include an application processor 214. The application processor 214 processes various applications of the wireless device 110, such as music players, web browsers, video streaming applications.

In one implementation, an RF portion 292 may include the PA 240, the duplexer 264, and the LNA 252. The RF portion 292 may operate on a voltage higher than the digital portions of the wireless device 110 and may receive the higher operating voltage from, e.g., a power management integrated circuit (not shown) incorporating the HVMOS transistors. The digital portions of the wireless device 110 may include, e.g., the baseband processor 212, the application processor 214, the mixers 236 and 256, etc. Various embodiments for MOS transistors and methods for fabricating the MOS transistors are provided. The MOS transistors may be suitable for high voltage operation such as, e.g., providing power to the RF portion 292. However, as those skilled in the art will readily appreciate, such aspects may be extended to other circuit configurations and devices. For example, For example, the exemplary embodiments are shown as silicon-on-insulator (SOI) devices, but the scope of the disclosure may apply to both SOI and bulk silicon devices. Moreover, the exemplary embodiments are shown as an N-type transistor, but the scope of the disclosure may include a P-type transistor having the disclosed P-type and N-type doping switched with each other, as known in the art. The wireless device 110 is shown as an example, but the scope of the disclosure is not limited to communication systems. In this disclosure, examples of "substantially surround" may include complete disclosure. Another example of "substantially surround" may be 50% or greater enclosure.

Figure 3A:
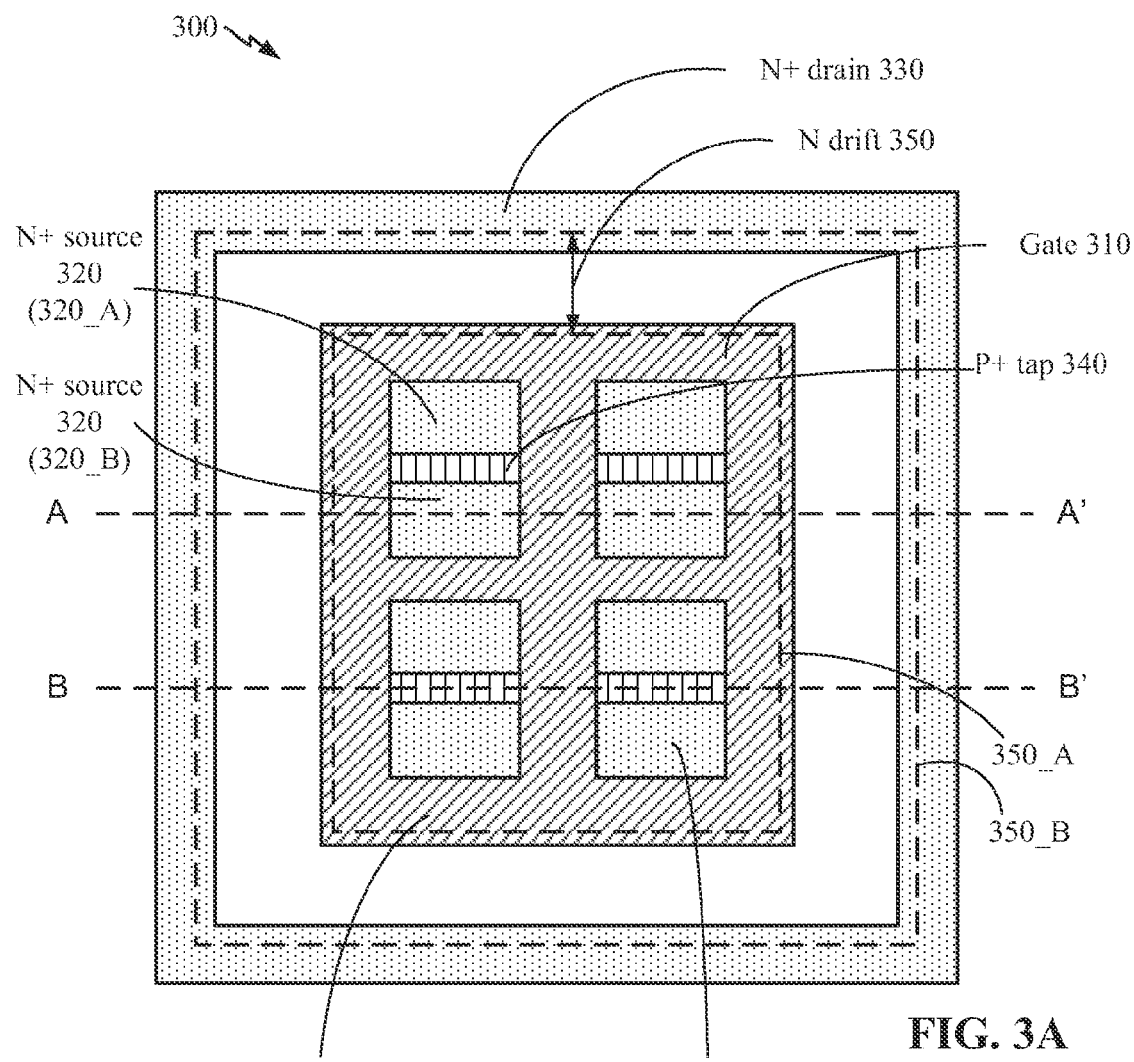
FIG. 3A is a diagram illustrating a top view of an exemplary embodiment of a MOS transistor.

FIG. 3A is a diagram illustrating a top view of an exemplary embodiment of a MOS transistor. The MOS transistor may be an N-type MOS (NMOS) transistor 300 suitable for high voltage operation (e.g., operating at a voltage above the digital portions of the wireless device 110). The MOS transistor 300 includes an N+ source (or drain) region 320. A P+ tap region 340 contacts (e.g., directly contacts) the N+source (or drain) region 320. In one implementation, the P+ tap region 340 is connected to a voltage potential, such as ground 399, to reduce voltage build-up in areas surrounding the N+ source (or drain) region 320. In one implementation, the N+ source (or drain) region 320 includes two sub-regions 320_A and 320_B, and wherein the P+ tap region 340 is disposed between the two sub-regions 320_A and 320_B. FIG. 3A provides a plurality of the N+ source (or drain) regions 320 arranged as a 2×2 array. Each of the N+ source (or drain) regions 320 is coupled to a P+ tap region 340.

A gate 310 (e.g., a gate electrode) substantially surrounds the N+ source (or drain) region 320 and the P+ tap region 340. In one implementation, the gate 310 is in a grid-form and surrounds the plurality of N+ source (or drain) regions 320 and P+ tap regions 340. A channel region 360 (see FIG. 3B) is formed under the gate 310 and likewise substantially surrounds the N+ source (or drain) region 320 and the P+ tap region 340. In one example, the gate 310 and the channel region 360 completely surround the N+ source (or drain) region 320 and the P+ tap region 340. In another example, the gate 310 and the channel region 360 surround more than one side of the N+ source (or drain) region 320 and the P+ tap region 340. An N-type or N+ drain (or source) region 330 substantially surrounds the gate 310 and the channel region 360. An N-type drift region 350 is between the N+ drain (or source) region 330 and the channel region 360 (see FIG. 3B). In one example, the N-type drift region 350 is doped lighter than, e.g., the N+ drain (or source) region 330 and the N+ source (or drain) region 320 and forms a resistive path therebetween. The N-type drift region 350 may cause a voltage-drop between the N+ drain (or source) region 330 and the N+ source (or drain) region 320 and improve (e.g., increase) a breakdown voltage of the transistor 300.

Figure 3B:
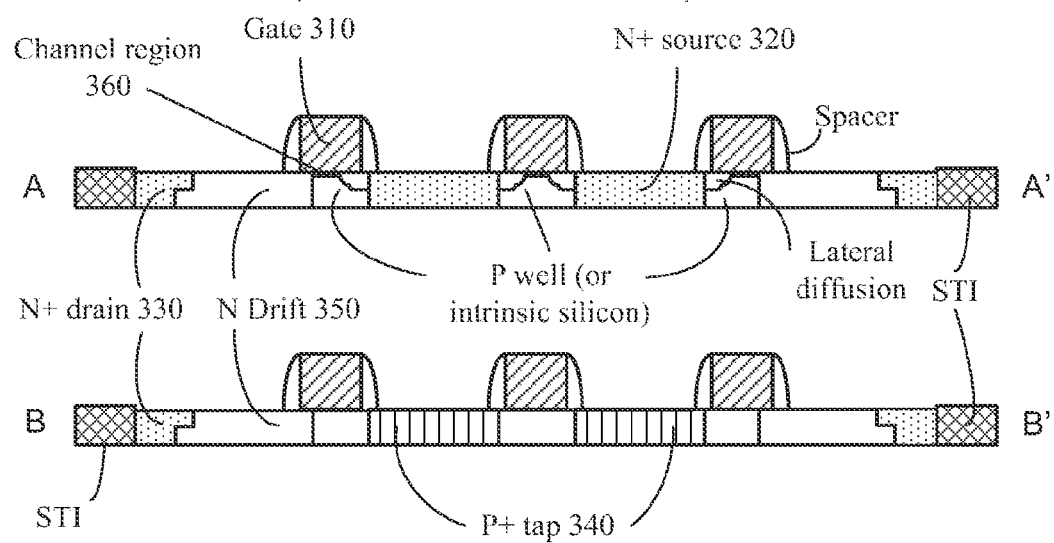
FIG. 3B is a diagram illustrating cross-section views of an exemplary embodiment of a MOS transistor along the A-A' and B-B' axes.

FIG. 3B is a diagram illustrating cross-section views of an exemplary embodiment of a MOS transistor along the A-A' and B-B' axes of FIG. 3A. In one implementation, the layers shown in FIG. 3B are suitable for fabrication by depositions on an insulator, such as sapphire, to form an SOI structure. The A-A' axis view illustrates the channel region 360 forming under the gate 310. E.g., the gate 310 overlaps the channel region 360. Likewise, the gate 310 overlaps the N-type drift region 350. The gate 310 may also overlap the lateral diffusion region of the N+ source (or drain) region 320. The lateral diffusion region may be formed by depositing the N+doping for the N+ source (or drain) region 320 at an angle, or formed inherently when depositing the N+doping for the N+ source (or drain) region 320. The B-B' axis view illustrates the P+ tap region 340. FIG. 3B also illustrates the P-type well 490 for the MOS transistor 300 and the shallow trench isolation (STI) 491 isolating the MOS transistor 300. The channel region 360 may, for example, formed in the P-type well 490 in a region overlapped by the gate 310.

FIG. 3C is a diagram illustrating an application of an exemplary embodiment of a MOS transistor. The MOS transistor 300 may be configured as in FIGS. 3A and 3B. The N+ source region 320 may be connected to VSS, such as ground 399. The N+ drain region 330 may be connected to a power source and provide power to the RF portion 292. The P+ tap region 340 is connected to VSS or ground 399. In one aspect, the MOS transistor 300 exhibits a high breakdown voltage, which may allow the MOS transistor 300 to be fabricated on the same substrate as the digital portions of the wireless device 110 even when connected to a high voltage power source.

Figure 5:
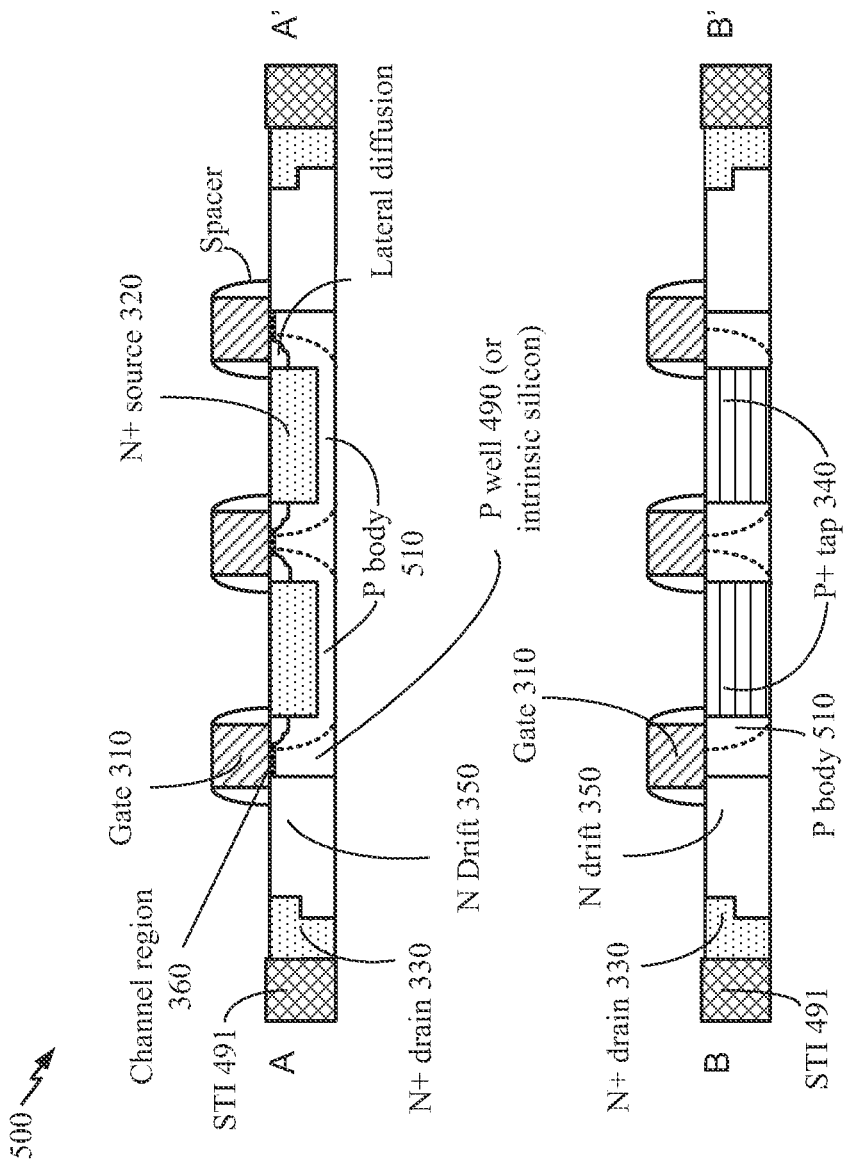
FIG. 5 is a diagram illustrating cross-section views of another exemplary embodiment of a MOS transistor along the A-A' and B-B' axes.

FIG. 4 is a diagram illustrating cross-section views of another exemplary embodiment of a MOS transistor along the A-A' and B-B' axes of FIG. 3A. In the MOS transistor 400, the N+ source (or drain) region 320 and the P+ tap region 340 are formed within a P-type body region 410. FIG. 5 illustrates cross-section views of another exemplary embodiment of a MOS transistor along the A-A' and B-B' axes of FIG. 3. In the transistor 500, the N+ source (or drain) region 320 and the P+tap region 340 are formed within a P-type body region 510, which includes a region beneath the N+ source (or drain) region 320. Thus, a portion of the P-type body region 510 overlaps the N+ source (or drain) region 320, which allows for a low resistive connection between the P-type body region 510 and the N+ source (or drain) region 320. In both the MOS transistor 400 and the MOS transistor 500, the P-type body region 410 or 510 overlaps (e.g., a portion been under) the gate 310 and substantially surrounds (e.g., complete surrounds) the N+ source (or drain) region 320 and the P+ tap region 340. The P-type body region 410 or 510 also contacts the N+ source (or drain) region 320 and the P+ tap region 340.

In one implementation, the MOS transistors 300, 400, and 500 may be formed without the P-type well 490. After an intrinsic silicon layer is formed on an insulator (for an SOI device), a subsequent P-type doping for the P-type well 490 may be blocked, and the N-type doping for the N-type drift region 350 may be applied globally. Thus, in one implementation, the N+ source (or drain) region 320 may be coupled to the N+ drain (or source) region 330 without a P-type well 490.

Figure 6:
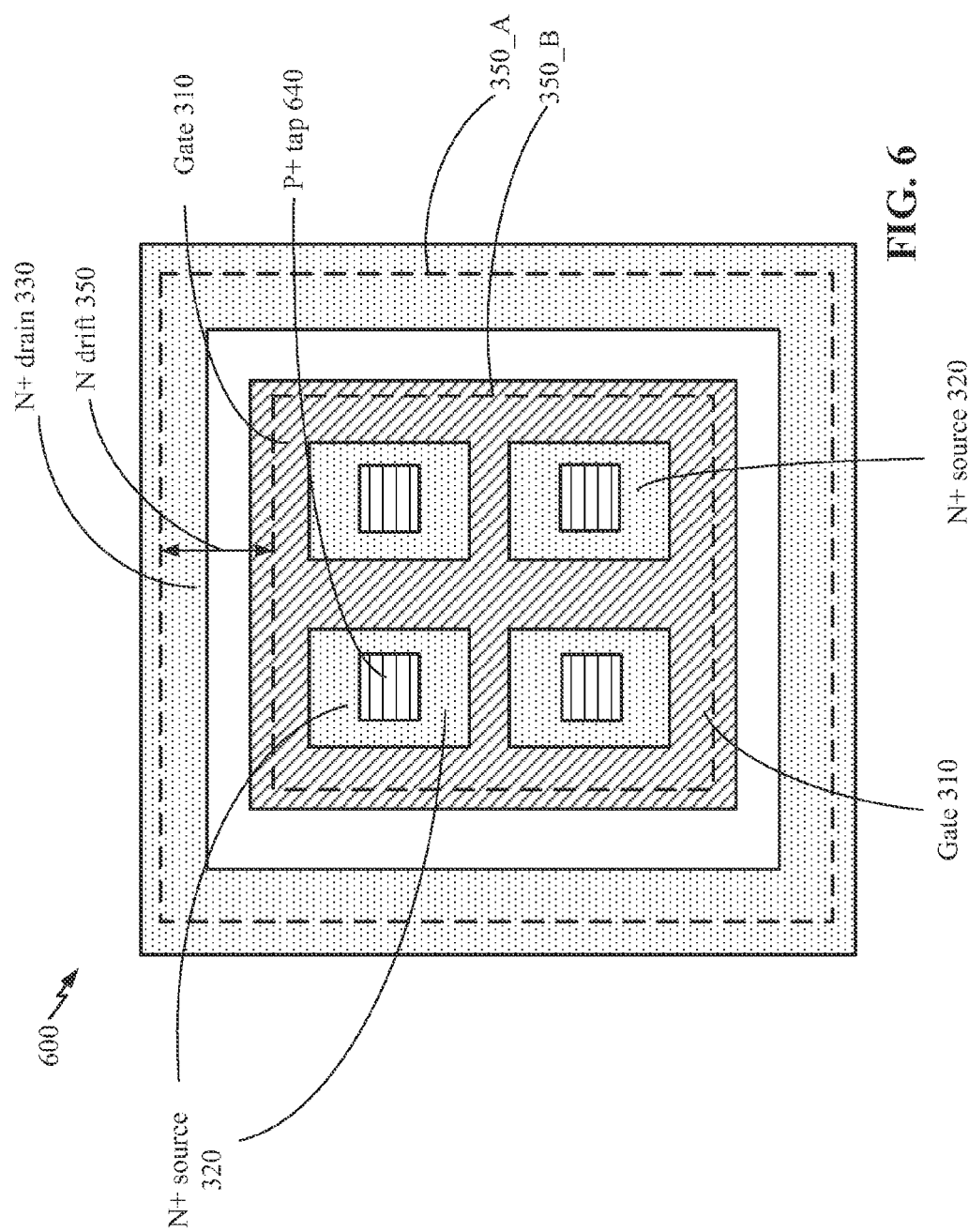
FIG. 6 is a diagram illustrating a top view of an exemplary embodiment of a MOS transistor.

FIG. 6 is a diagram illustrating a top view of an exemplary embodiment of a MOS transistor. The MOS transistor may be an N-type MOS (NMOS) transistor 600 suitable for high voltage operation (e.g., operating at a voltage above the digital portions of the wireless device 110). The MOS transistor 600 includes an N-type or N+ source (or drain) region 320. A P+ tap region 640 contacts (e.g., directly contacts) the N+ source (or drain) region 320. In one implementation, the P+ tap region 640 is connection to a voltage potential, such as ground 399, to reduce voltage build-up in areas surrounding the N+ source (or drain) region 320. In one implementation, the N+ source (or drain) region 320 substantially surrounds the P+tap region 640 (e.g., completely surrounds). FIG. 6 provides a plurality of the N+source (or drain) regions 320 arranged as a 2×2 array. Each of the N+ source (or drain) regions 320 is coupled to and contains a P+ tap region 640.

The MOS transistor 600 may otherwise be structured similarly to the MOS transistors 300, 400, and 500. For example, an N-type drift region 350 may substantially surround the gate 310 and the channel region 360 and is between the N+ drain (or source) region 330 and the channel region 360 (see FIG. 3B). A channel region 360 is formed under the gate 310 and substantially surrounds the N+source (or drain) region 320 and the P+ tap region 640. In one example, the gate 310 and the channel region 360 completely surround the N+ source (or drain) region 320 and the P+ tap region 640. In another example, the gate 310 and the channel region 360 surround more one side of the N+ source (or drain) region 320. The N+source (or drain) region 320 and the P+ tap region 640 may be formed within a P-type body region 510, which includes a region beneath the N+ source (or drain) region 320. Thus, a portion of the P-type body region 510 overlaps the N+ source (or drain) region 320, which allows for a low resistive connection between the P-type body region 510 and the N+ source (or drain) region 320. The P-type body region 410 or 510 overlaps (e.g., a portion been under) the gate 310 and substantially surrounds (e.g., complete surrounds) the N+ source (or drain) region 320 and the P+ tap region 640. The P-type body region 410 or 510 also contacts the N+ source (or drain) region 320 and the P+ tap region 640 (FIGS. 4 and 5). In one implementation, the MOS transistor 600 may include a P-type well 490, and the N+source (or drain) region 320 and the N+ drain (or source) region 330 are coupled via the P-type well 490. In another implementation, a subsequent P-type doping for the P-type well 490 may be blocked, and the N-type doping for the N-type drift region 350 may be applied globally. Thus, in one implementation, the N+ source (or drain) region 320 may be coupled to the N+ drain (or source) region 330 without a P-type well 490.

Figure 7:
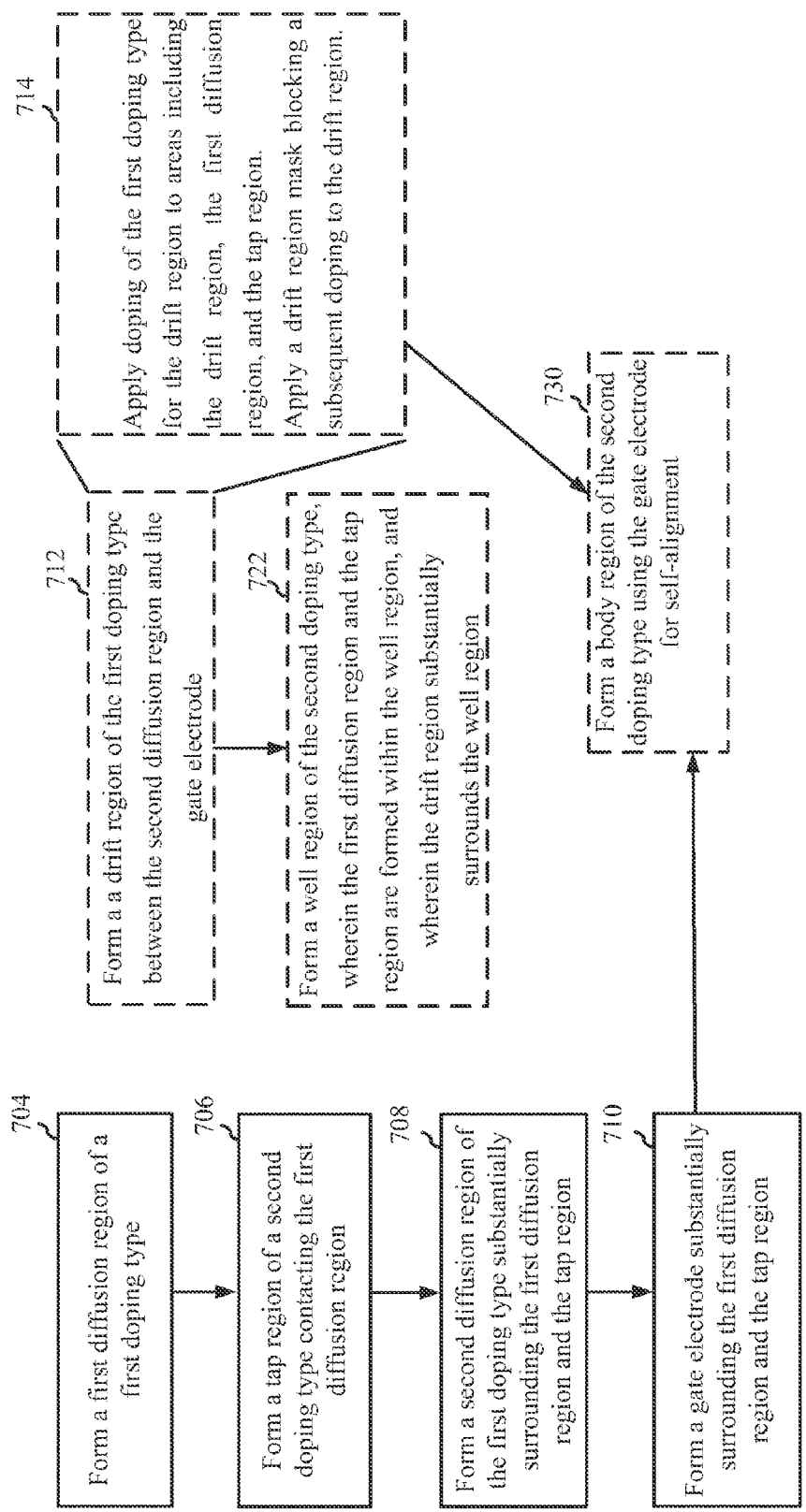
FIG. 7 is a flowchart of an exemplary embodiment of a method for fabricating a MOS transistor.

FIG. 7 is a flowchart of an exemplary embodiment of a method for fabricating a MOS transistor (such as the MOS transistors 300, 400, 500, and 600). Steps shown in dotted lines may be optional. The order presented may not necessarily indicate a required sequence. The steps may be performed in any order as recognized by a person of ordinary skill in the art. At 704, a first diffusion region of a first doping type is formed. For example, the N+ source (or drain) region 320 is formed using photoresist masks, etching, and deposition as known in the art. At 706, a tap region of a second doping type is formed contacting the first diffusion region. For example, the P+ tap region 340 or the P+ tap region 640 may be formed using photoresist masks, etching, and deposition as known in the art. The P+ tap region 340 or the P+ tap region 640 may contact the N+ source (or drain) region 320.

At 708 a second diffusion region of the first doping type substantially surrounding the first diffusion region and the tap region is formed. For example, the N+ drain (or source) region 330 may be formed using photoresist masks, etching, and deposition as known in the art. The N+ drain (or source) region 330 substantially surrounds the P+ tap region 340 (or the P+ tap region 640) and the N+ source (or drain) region 320. At 710, a gate electrode substantially surrounding the first diffusion region and the tap region is formed. For example, the gate 310 may be formed using photoresist masks, etching, and deposition as known in the art. The gate 310 substantially surrounds the P+ tap region 340 (or the P+ tap region 640) and the N+ source (or drain) region 320.

At 712, a drift region of the first doping type is formed between the second diffusion region and the gate electrode. For example, the N-type drift region 350 is between the N+ drain (or source) region 330 and the gate 310 (see FIG. 3B). The N-type drift region 350 may be formed using photoresist masks, etching, and deposition as known in the art (more details are provided below and in FIG. 8). At 722, a well region of the second doping type is formed. The first diffusion region and the tap region are formed within the well region, and the drift region substantially surrounds the well region. For example, the P-type well 490 may be formed using photoresist masks, etching, and deposition as known in the art. For example, the N+ source (or drain) region 320 and the P+ tap region 340 are formed within an area defined by the P-type well 490 (see FIGS. 3A and 3B). The N-type drift region 350 substantially surrounds the P-type well 490. In alternative to step 722, the MOS transistor may be without the P-type well 490.

Figure 8:
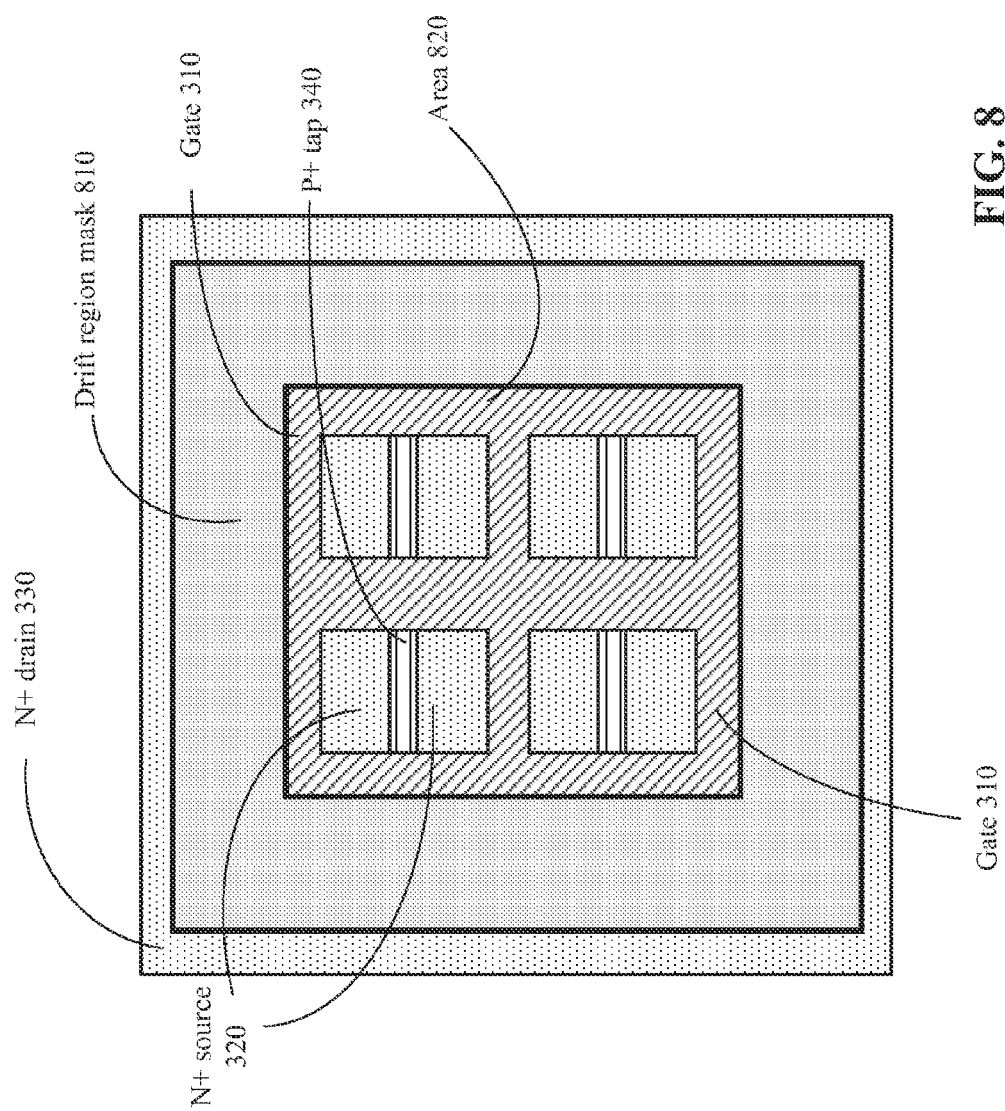
FIG. 8 is a diagram illustrating an exemplary embodiment of a drift region mask.

At 714, the drift region is formed by applying doping of the first doping type for the drift region to areas including the drift region and the well region and applying a drift region mask defining the drift region and blocking a subsequent doping to the drift region. For example, an N-type doping (for forming the N-type drift region 350) may be applied globally, including areas for N-type drift region 350 and areas corresponding to the gate 310, the N+ source (or drain) region 320, and the P+ tap region 340. A drift region mask defining the N-type drift region 350 is applied for blocking a subsequent doping to the N-type drift region 350. For example, P-type doping may be applied to the areas after the N-type doping for the N-type drift region 350, except to the N-type drift region 350 defined by the drift region mask. FIG. 8 is a diagram illustrating an exemplary embodiment of a drift region mask. An N-type drift region mask 810 defines the N-type drift region 350. The N-type doping (for forming the N-type drift region 350) may be applied globally, including areas for N-type drift region 350 and the area 820 (corresponding to the areas of the gate 310, the N+ source (or drain) region 320, and the P+ tap region 340). The N-type drift region mask 810 defining the N-type drift region 350 is applied. Subsequent doping such as a P-type doping for the P+ tap region 340 and an N-type doping for the N+ source (or drain) region 320 may be applied to the area 820, but blocked at the N-type drift region 350 by the N-type drift region mask 810.

At 730, the gate electrode is formed using the drift region mask for self-alignment. For example, the gate 310 may be formed by metal deposition using the edge 840 of the N-type drift region mask 810 for self-alignment. At 732, a body region of the second doping type is formed using the gate electrode for self-alignment. For example, the P-type body region 410 may be formed by a P-type doping, an edge of the doping being defined by the gate 310.

FIG. 9A is a diagram illustrating a flow chart 900 of a method of an exemplary embodiment for laying out a MOS transistor. The method may be performed by a computer. At 902, a layout cell is stored in a memory. The layout cell includes information indicating a single instance of a first diffusion region of a first doping type, a single instance of a tap region of a second doping type contacting the first diffusion region, and a single instance of a channel region substantially surrounding the first diffusion region and the tap region. FIG. 9B is a diagram illustrating an exemplary embodiment of a layout cell. For example, the stored layout cell 910 may include layout information for the N+ source (or drain) region 320, the channel region 360, and the P+ tap region 340. At 906, the layout cell is duplicated. The duplicated cells are configured as an array. For example, the stored layout cell 910 may be duplicated as a 2×2 array to form the transistor 300 of FIG. 3A.

Figure 10:
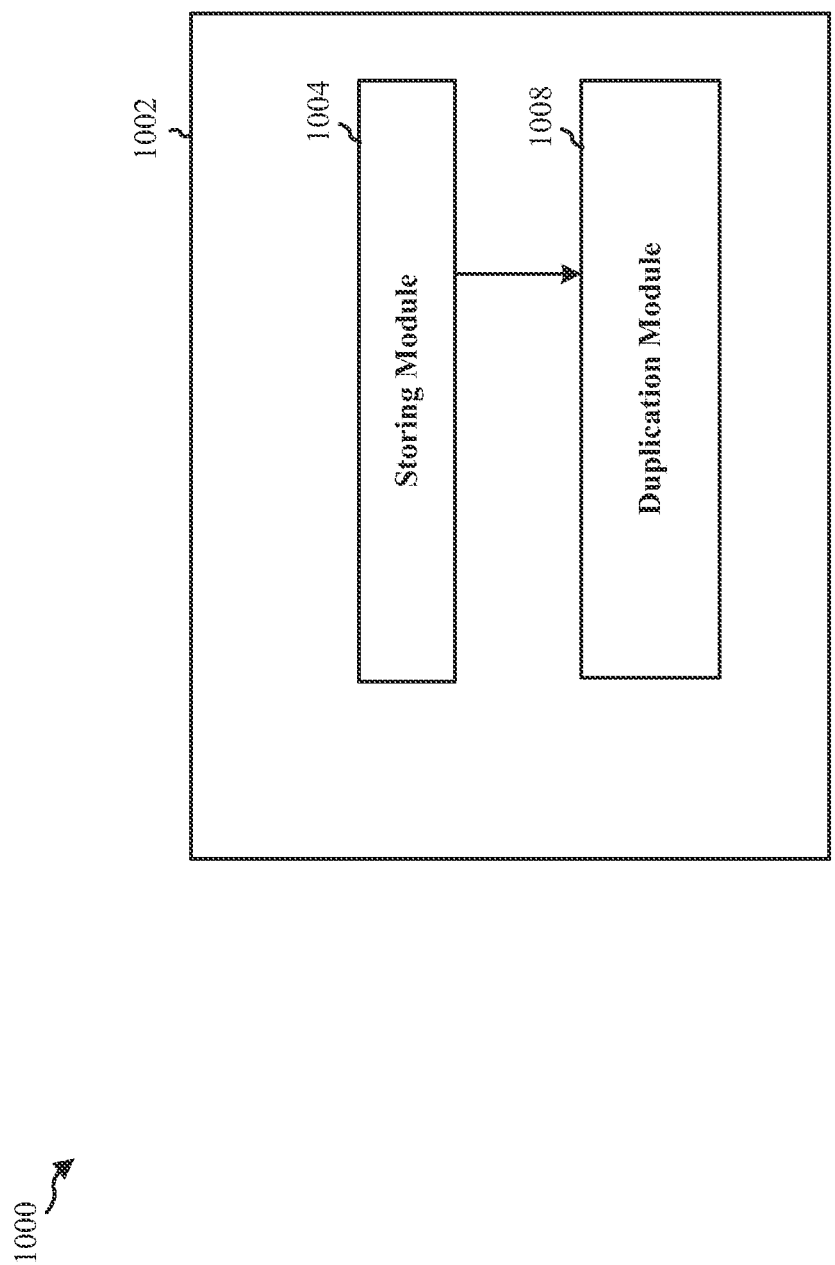
FIG. 10 is a conceptual data flow diagram illustrating the data flow between different modules/means/components in an exemplary apparatus.

FIG. 10 is a conceptual data flow diagram 1000 illustrating the data flow between different modules/means/components in an exemplary apparatus 1002. The apparatus may be a computer. The apparatus includes a storing module 1004 that provides the means for storing a layout cell in a memory. The layout cell includes information indicating a single instance of a first diffusion region of a first doping type, a single instance of a tap region of a second doping type contacting the first diffusion region, and a single instance of a channel region substantially surrounding the first diffusion region and the tap region. The apparatus includes a duplication module 1008 for duplicating the stored layout cell.

Figure 9:
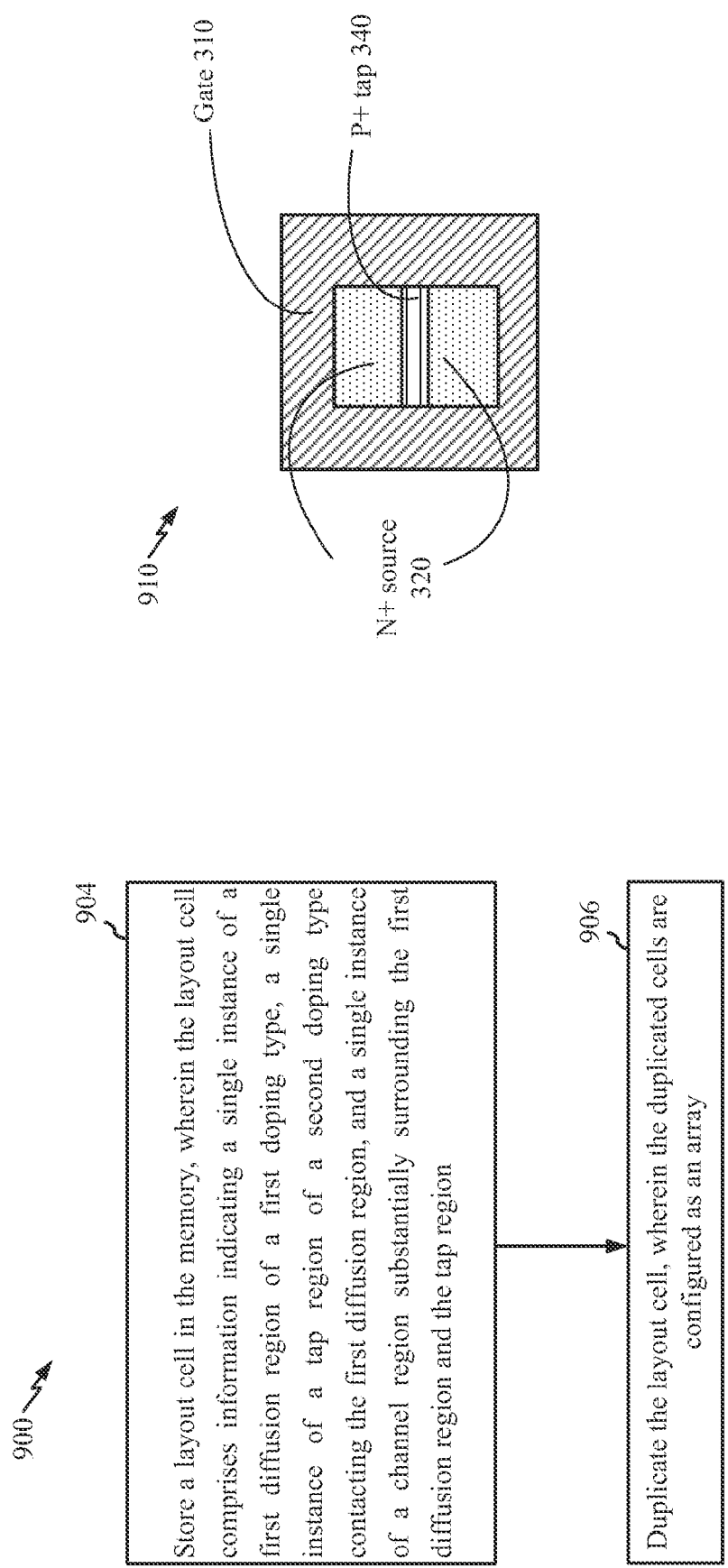
FIG. 9A is a diagram illustrating a flow chart of a method of an exemplary embodiment for laying out a MOS transistor.
FIG. 9B is a diagram illustrating an exemplary embodiment of a layout cell.
Figure 11:
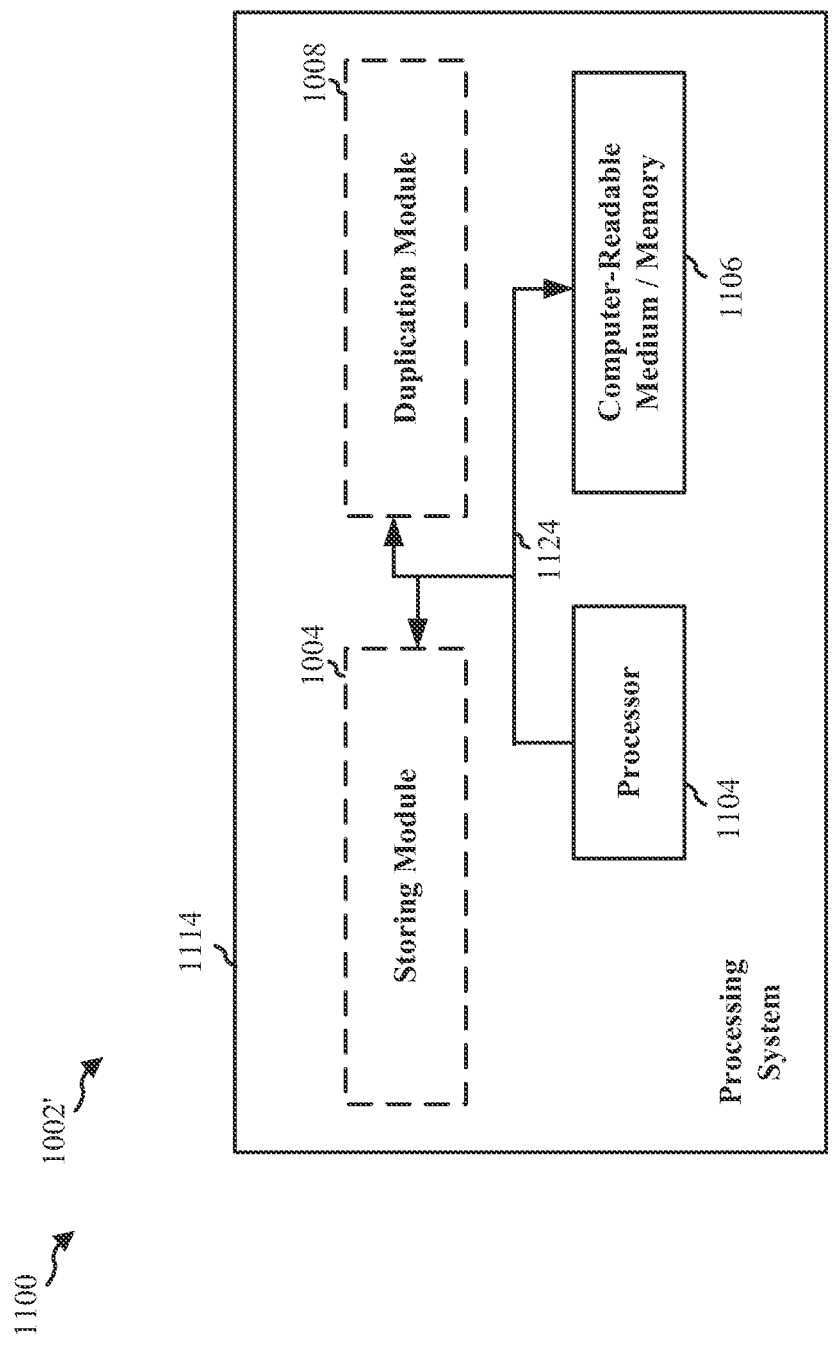
FIG. 11 is a diagram illustrating an example of a hardware implementation for an apparatus employing a processing system.

The apparatus may include additional modules that perform each of the steps of the algorithm in the aforementioned flow charts of FIG. 9. As such, each step in the aforementioned flow charts of FIG. 9 may be performed by a module and the apparatus may include one or more of those modules. The modules may be one or more hardware components specifically configured to carry out the stated processes/algorithm, implemented by a processor configured to perform the stated processes/algorithm, stored within a computer-readable medium for implementation by a processor, or some combination thereof FIG. 11 is a diagram 1100 illustrating an example of a hardware implementation for an apparatus 1002' employing a processing system 1114. The processing system 1114 may be implemented with a bus architecture, represented generally by the bus 1124. The bus 1124 may include any number of interconnecting buses and bridges depending on the specific application of the processing system 1114 and the overall design constraints. The bus 1124 links together various circuits including one or more processors and/or hardware modules, represented by the processor 1104, the modules 1004 and 1004, and the computer-readable medium/memory 1106. The bus 1124 may also link various other circuits such as timing sources, peripherals, voltage regulators, and power management circuits, which are well known in the art, and therefore, will not be described any further.

The processing system 1114 includes a processor 1104 coupled to a computer-readable medium/memory 1106. The processor 1104 is responsible for general processing, including the execution of software stored on the computer-readable medium/memory 1106. The software, when executed by the processor 1104, causes the processing system 1114 to perform the various functions described supra for any particular apparatus. The computer-readable medium/memory 1106 may also be used for storing data that is manipulated by the processor 1104 when executing software. The processing system further includes at least one of the modules 1004 and 1008. The modules may be software modules running in the processor 1104, resident/stored in the computer readable medium/memory 1106, one or more hardware modules coupled to the processor 1104, or some combination thereof It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A metal-oxide-semiconductor transistor, comprising:
a first diffusion region of a first doping type;
a tap region of a second doping type configured to contact the first diffusion region;
a channel region configured to substantially surround the first diffusion region and the tap region; and
a second diffusion region of the first doping type configured to substantially surround the channel region.

2. The metal-oxide-semiconductor transistor of claim 1, wherein the first diffusion region comprises two sub-regions, and wherein the tap region is disposed between the two sub-regions.

3. The metal-oxide-semiconductor transistor of claim 1, further comprising a drift region of the first doping type configured between the second diffusion region and the channel region.

4. The metal-oxide-semiconductor transistor of claim 3, further comprising a gate electrode configured to overlap the channel region, wherein the drift region is configured to partially overlap the gate electrode.

5. The metal-oxide-semiconductor transistor of claim 4, further comprising a body region of the second doping type configured to overlap the gate electrode and configured to substantially surround the first diffusion region and the tap region.

6. The metal-oxide-semiconductor transistor of claim 5, wherein the body region of the second doping type is configured to contact the first diffusion region and the tap region.

7. The metal-oxide-semiconductor transistor of claim 5, wherein the body region further comprises a portion that overlaps the first diffusion region.

8. The metal-oxide-semiconductor transistor of claim 1, further comprising:
a gate electrode;
a plurality of first diffusion regions of the first doping type including the first diffusion region; and
a plurality of tap regions of the second doping type including the tap region of the second doping type,
wherein the gate electrode substantially surrounds each of the plurality of first diffusion regions of the first doping type and each of the plurality of tap regions of the second doping type.

9. The metal-oxide-semiconductor transistor of claim 1, wherein the second diffusion region is coupled to the first diffusion region without a well region of the second doping type.

10. The metal-oxide-semiconductor transistor of claim 1, wherein the first diffusion region is configured to substantially surround the tap region.

11. The metal-oxide-semiconductor transistor of claim 10, further comprising a drift region of the first doping type configured between the second diffusion region and the channel region.

12. The metal-oxide-semiconductor transistor of claim 11, further comprising a gate electrode configured to overlap the channel region, wherein the drift region is configured to partially overlap the gate electrode.

13. The metal-oxide-semiconductor transistor of claim 12, further comprising a body region of the second doping type configured to overlap the gate electrode and configured to substantially surround the first diffusion region and the tap region.

14. The metal-oxide-semiconductor transistor of claim 13, wherein the body region of the second doping type is configured to contact the first diffusion region and the tap region.

15. The metal-oxide-semiconductor transistor of claim 10, further comprising:
a gate electrode;
a plurality of first diffusion regions of the first doping type including the first diffusion region; and
a plurality of tap regions of the second doping type including the tap region of the second doping type,
wherein the gate electrode substantially surrounds each of the plurality of first diffusion regions of the first doping type and each of the plurality of tap regions of the second doping type.

16. The metal-oxide-semiconductor transistor of claim 10, wherein the second diffusion region is coupled to the first diffusion region without a well region of the second doping type.

17. A method for manufacturing a metal-oxide-semiconductor transistor, comprising:
forming a first diffusion region of a first doping type;
forming a tap region of a second doping type contacting the first diffusion region;
forming a second diffusion region of the first doping type substantially surrounding the first diffusion region and the tap region; and
forming a gate electrode substantially surrounding the first diffusion region and the tap region.

18. The method of claim 17, wherein the first diffusion region comprises two sub-regions, wherein the tap region is disposed between the two sub-regions.

19. The method of claim 17, wherein the first diffusion region substantially surrounds the tap region.

20. The method of claim 17, further comprising forming a drift region of the first doping type between the second diffusion region and the gate electrode.

21. The method of claim 20, further comprising forming a well region of the second doping type, wherein the first diffusion region and the tap region are formed within the well region, and wherein the drift region substantially surrounds the well region.

22. The method of claim 20, wherein the forming the drift region comprises:
applying doping of the first doping type for the drift region to areas including the drift region, the first diffusion region, and the tap region;
applying a drift region mask defining the drift region and blocking a subsequent doping to the drift region.

23. The method of claim 22, wherein the forming the gate electrode uses the drift region mask for self-alignment.

24. The method of claim 23, further comprising forming a body region of the second doping type using the gate electrode for self-alignment.

25. An apparatus for generating a layout of a metal-oxide-semiconductor transistor, comprising:
a memory;
at least one processor coupled to the memory, wherein the at least one processor is configured to:
store a layout cell in the memory, wherein the layout cell comprises information indicating:

a single instance of a first diffusion region of a first doping type, a single instance of a tap region of a second doping type contacting the first diffusion region, and a single instance of a channel region substantially surrounding the first diffusion region and the tap region;

duplicate the layout cell, wherein the duplicated cells are configured as an array.

26. The apparatus of claim 25, wherein the duplicated layout cells are substantially surrounded by a second diffusion region of the first doping type.

27. The apparatus of claim 25, wherein the first diffusion region comprises two sub-regions, wherein the tap region is disposed between the two sub-regions.

28. The apparatus of claim 25, wherein the first diffusion region substantially surrounds the tap region.

* * * * *